(12) United States Patent
Langdon et al.

(10) Patent No.: US 6,659,002 B2
(45) Date of Patent: Dec. 9, 2003

(54) SCREENING APPARATUS WITH TRAILING SQUEEGEE AND METHOD OF SCREENING

(75) Inventors: Daniel T. Langdon, Poughkeepsie, NY (US); Keith C. O'Neil, Hughsonville, NY (US); Kurt A. Smith, Poughkeepsie, NY (US); Randall J. Werner, Poughkeepsie, NY (US); Ralph R. Comulada, Jr., Rock Tavern, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 09/999,373

(22) Filed: Oct. 31, 2001

(65) Prior Publication Data

US 2003/0079627 A1 May 1, 2003

(51) Int. Cl.[7] .................................................. B05C 17/04
(52) U.S. Cl. ....................................... 101/123; 101/129
(58) Field of Search ................................ 101/123, 124, 101/126, 127, 129

(56) References Cited

U.S. PATENT DOCUMENTS

| | | | |
|---|---|---|---|
| 5,309,837 A | 5/1994 | Nanzai | |
| 5,478,700 A | 12/1995 | Gaynes et al. | |
| 5,553,538 A | 9/1996 | Freitag | |
| 5,553,540 A | 9/1996 | Tani | |
| 5,746,127 A | * 5/1998 | Fischbeck et al. | 101/123 |
| 5,953,986 A | * 9/1999 | Murakami | 101/123 |
| 6,101,937 A | 8/2000 | Murakami | |
| 6,289,804 B1 | * 9/2001 | Williams | 101/127.1 |
| 6,453,810 B1 | * 9/2002 | Rossmeisl et al. | 101/123 |

* cited by examiner

Primary Examiner—Ren Yan
(74) Attorney, Agent, or Firm—Ira D. Blecker

(57) ABSTRACT

Screening of a workpiece utilizing a screening apparatus which includes a paste dispensing apparatus and a trailing squeegee assembly in close proximity to the paste dispensing apparatus. When the screening apparatus is operable, the squeegee assembly is in contact with the workpiece at the same time as a paste is dispensed from the paste dispensing apparatus.

10 Claims, 3 Drawing Sheets

SCREENING APPARATUS WITH TRAILING SQUEEGEE AND METHOD OF SCREENING

BACKGROUND OF THE INVENTION

The present invention relates generally to the screening of viscous materials onto a surface through a mask having a plurality of openings therein and, more particularly, relates to an improved process and apparatus for screening of metallic pastes and the like onto ceramic greensheets and other materials.

Ceramic greensheets having metallic pastes thereon are used in the electronics industry to form so-called packages or substrates. After the ceramic greensheets have been formed into the packages or substrates, semiconductor devices or chips may be mounted thereon. Such packages or substrates are also often called chip carriers.

A key step in the manufacturing process is the deposition of the metallic pastes. The metallic pastes are used to form wiring lines on the surface of the ceramic greensheets and vias in the ceramic greensheets which electrically connect different layers of wiring lines. The metallic pastes may be deposited by screening through a mask.

In one form of screening process, a low pressure paste nozzle forces the metallic paste through a mesh mask. This process is often referred to as mesh screening. The pastes used in mesh screening generally have low viscosity.

In a second form of screening process, a high pressure paste nozzle "extrudes" paste through a metallic mask. This process is often referred to as extrusion screening. The pastes used in extrusion screening generally have high viscosity.

While the present invention is more directed to extrusion screening, the purposes and the advantages of the present invention have general applicability to mesh screening as well. Thus, while the following discussion will be centered on extrusion screening, it should be understood that mesh screening is not excluded from the scope of the invention.

In extrusion screening, the wiring lines and vias may be filled in a single pass. However, the present inventors have discovered that when attempting to screen wiring lines that are perpendicular to the screening direction, some wiring lines experience areas which are partially or totally devoid of paste material. Such areas are called mousebites and dirty opens. Mousebites and dirty opens are undesirable because they present yield and reliability issues and thus they should be avoided.

Also in extrusion screening, the mask is cleaned each time a ceramic greensheet is screened. The more metallic pastes that are left on the mask, the harder it is to clean the mask. Thus, masks with less screening residue are desired.

Various improvements have been proposed by those skilled in the art of screening.

Nanzai U.S. Pat. No. 5,309,837, the disclosure of which is incorporated by reference herein, discloses an apparatus featuring paste spreading squeegees which are used to deposit and then spread a paste through a stencil mask.

Gaynes et al. U.S. Pat. No. 5,478,700, the disclosure of which is incorporated by reference herein, discloses several nozzles for the deposition of solders through a mask. The nozzles utilized have a thin leading lip and a thicker trailing lip. The trailing lip, as noted in the disclosure, operates as a squeegee. The trailing lip may be rigid or, to enhance its squeegee action, may be flexible. Such a trailing lip will not improve line height for those lines that are perpendicular to the direction of screening nor will the amount of metallic paste removed from the mask be minimized.

Freitag U.S. Pat. No. 5,553,538, the disclosure of which is incorporated by reference herein, discloses stencil mask printing of solder wherein a quantity of solder is deposited on the mask and then squeegeed into the openings in the mask.

Tani U.S. Pat. No. 5,553,540, the disclosure of which is incorporated by reference herein, discloses apparatus for the printing of viscous material onto a circuit board through a screen. The screening apparatus is a dispenser with a housing, a chamber for containing the viscous material and a slit-like bottom aperture. A height adjustable trailing squeegee blade is provided to apply variable pressure on the viscous material through the screen.

Murakami U.S. Pat. No. 6,101,937, the disclosure of which is incorporated by reference herein, discloses a screen printing apparatus having a group of paste dispensers and a squeegee unit. In one embodiment, the paste dispensers and squeegee unit move in unison. However, it is also noted in Murakami that the squeegee unit and paste dispensers do not operate at the same time.

Notwithstanding the aforementioned prior art, there remains a need for an apparatus and process for reliably and dependably depositing a paste through a mask.

Accordingly, it is a purpose of the present invention to have an apparatus and process which reliably and dependably deposits a paste through a mask.

It is another purpose of the present invention to have an apparatus and process which deposits a paste through a mask without forming mousebites and dirty opens in the deposited pattern.

It is yet another purpose of the present invention to have an apparatus and process which deposits a paste through a mask and minimizes the amount of paste left on the mask.

These and other purposes of the present invention will become more apparent after referring to the following description considered in conjunction with the accompanying drawings.

BRIEF SUMMARY OF THE INVENTION

The purposes of the invention have been achieved by providing, according to a first aspect of the present invention a screening apparatus comprising:

a paste dispensing apparatus for dispensing a paste onto a workpiece;

a squeegee assembly in close proximity to the paste dispensing apparatus for squeegeeing the paste over the workpiece; and a means for translating the paste dispensing apparatus and squeegee assembly in unison with the squeegee assembly trailing behind the paste dispensing apparatus;

wherein, in operation, the paste dispensing apparatus and squeegee assembly are placed adjacent to a workpiece and the paste dispensing apparatus and squeegee assembly are translated by the translating means in unison such that the paste is dispensed by the paste dispensing apparatus and then squeegeed by the trailing squeegee assembly, the squeegee assembly being in contact with the workpiece at the same time as the paste is being dispensed.

According to a second aspect of the invention, there is provided a method of screening a workpiece through a mask with a screening apparatus comprising a paste dispensing apparatus and a squeegee assembly, the method comprising the steps of:

providing a mask having a plurality of openings over a workpiece;

placing the screening apparatus adjacent to the mask;

translating the screening apparatus over the mask while simultaneously (i) dispensing a paste onto the mask and (ii) squeegeeing the paste with the squeegee assembly to force the dispensed paste into the mask openings and to remove excess paste from the mask.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
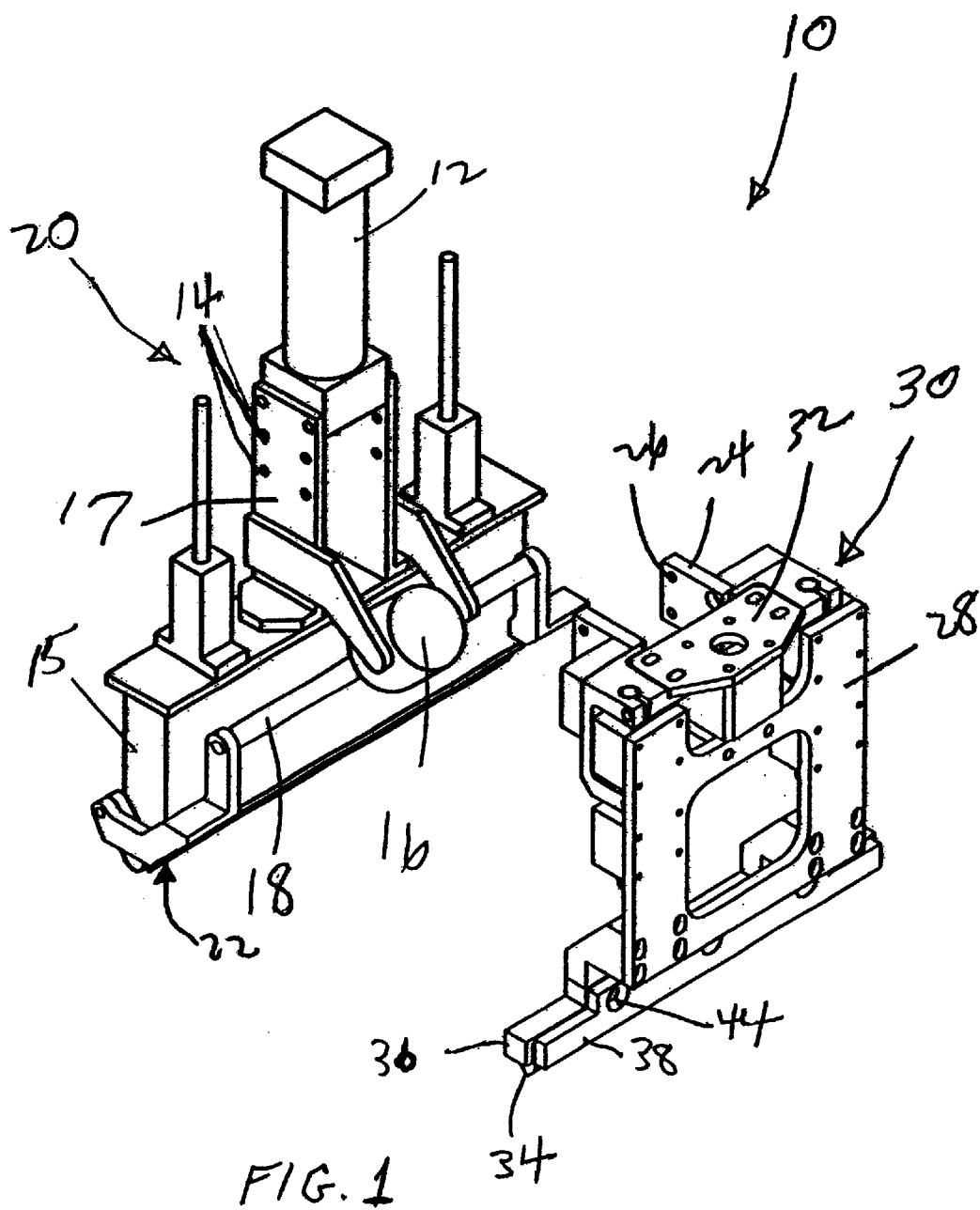
FIG. 1 is an exploded perspective view of the screening apparatus according to the present invention showing the paste dispensing apparatus and squeegee assembly.
Figure 4:
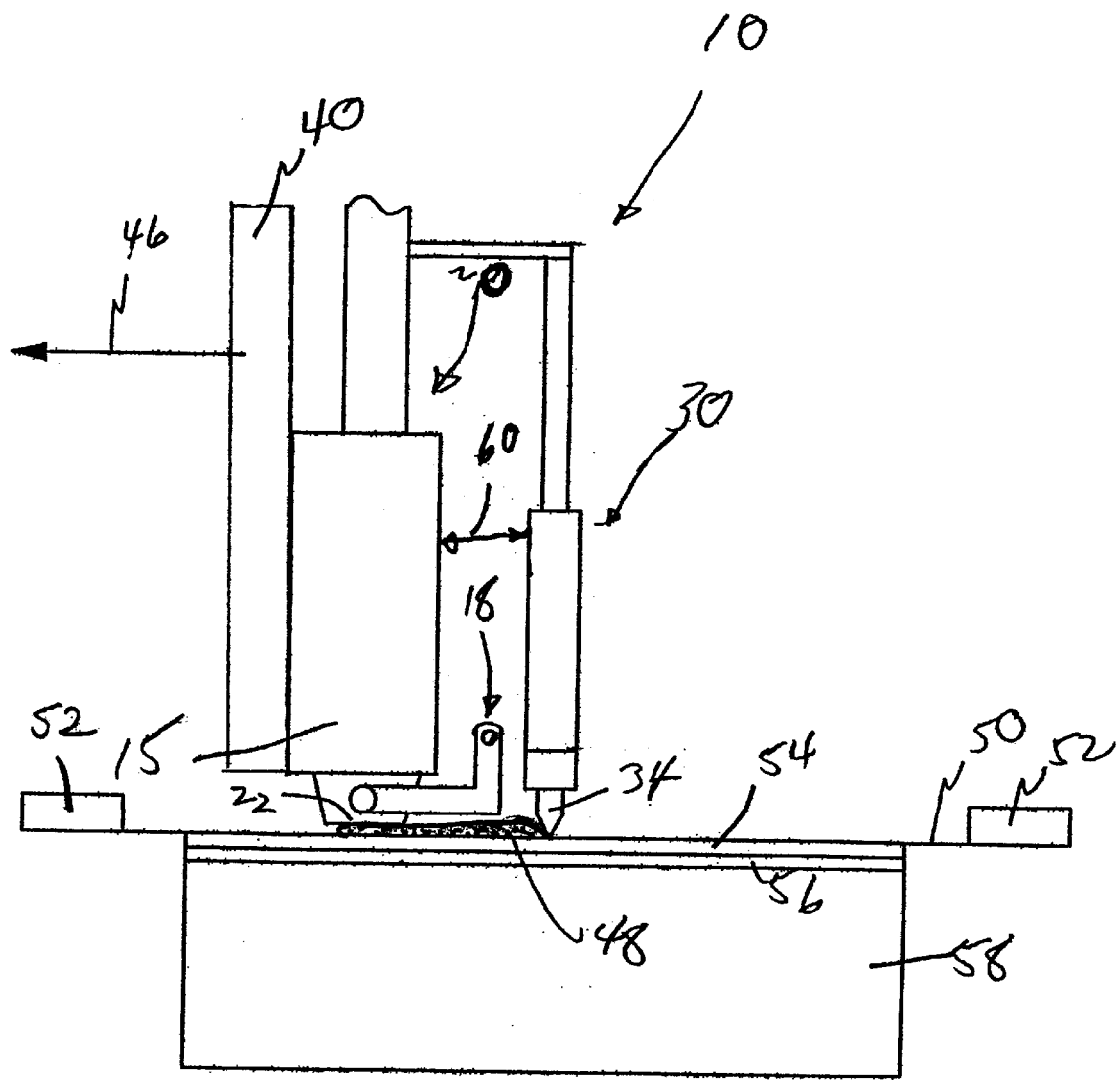
FIG. 4 is a schematic side view of the assembled screening apparatus according to the present invention showing the operation of the screening apparatus.

Referring to the Figures in more detail, and particularly referring to FIG. 1, there is shown an exploded view of the screening apparatus 10 according to the present invention. The screening apparatus 10 comprises a paste dispensing apparatus 20, a squeegee assembly 30 and a means 40 (as schematically illustrated in FIG. 4) for translating the screening apparatus 10.

The paste dispensing apparatus 20 is conventional in nature and includes a paste reservoir 15 with a shutter 22 through which a paste, usually a viscous paste, is dispensed onto a workpiece. The shutter 22 is operable by actuator bar 18 which is driven by air cylinder 16. Air cylinder 12 drives a plunger (not shown) to cause paste to be extruded under pressure from the paste reservoir 15 through shutter 22 and onto a workpiece.

Again, while the present invention has applicability to both mesh and extrusion screening, the present invention is described in the Figures with respect to an extrusion screening application and, for the most part, the remainder of the discussion will be focused on extrusion screening.

The conventional paste dispensing apparatus shown in FIG. 1 has been modified by the addition of apertures 14 in bracket 17 for attachment of the squeegee assembly 30. As can be seen by referring to squeegee assembly 30, brackets 24 have apertures 26 which align with apertures 14 in bracket 17 of the paste dispensing apparatus 20. Bolts or other fastening means (not shown) are threaded into apertures 26 and 14 to firmly hold the squeegee assembly 30 to paste dispensing assembly 20.

Squeegee assembly 30 has a mounting plate 28 which has a block 36 and jaw 38 for gripping a squeegee 34. Fasteners (not shown) are inserted into apertures 44 to hold jaw 38 in place with respect to block 36 to thereby grip squeegee 34.

Figures 2, 3:
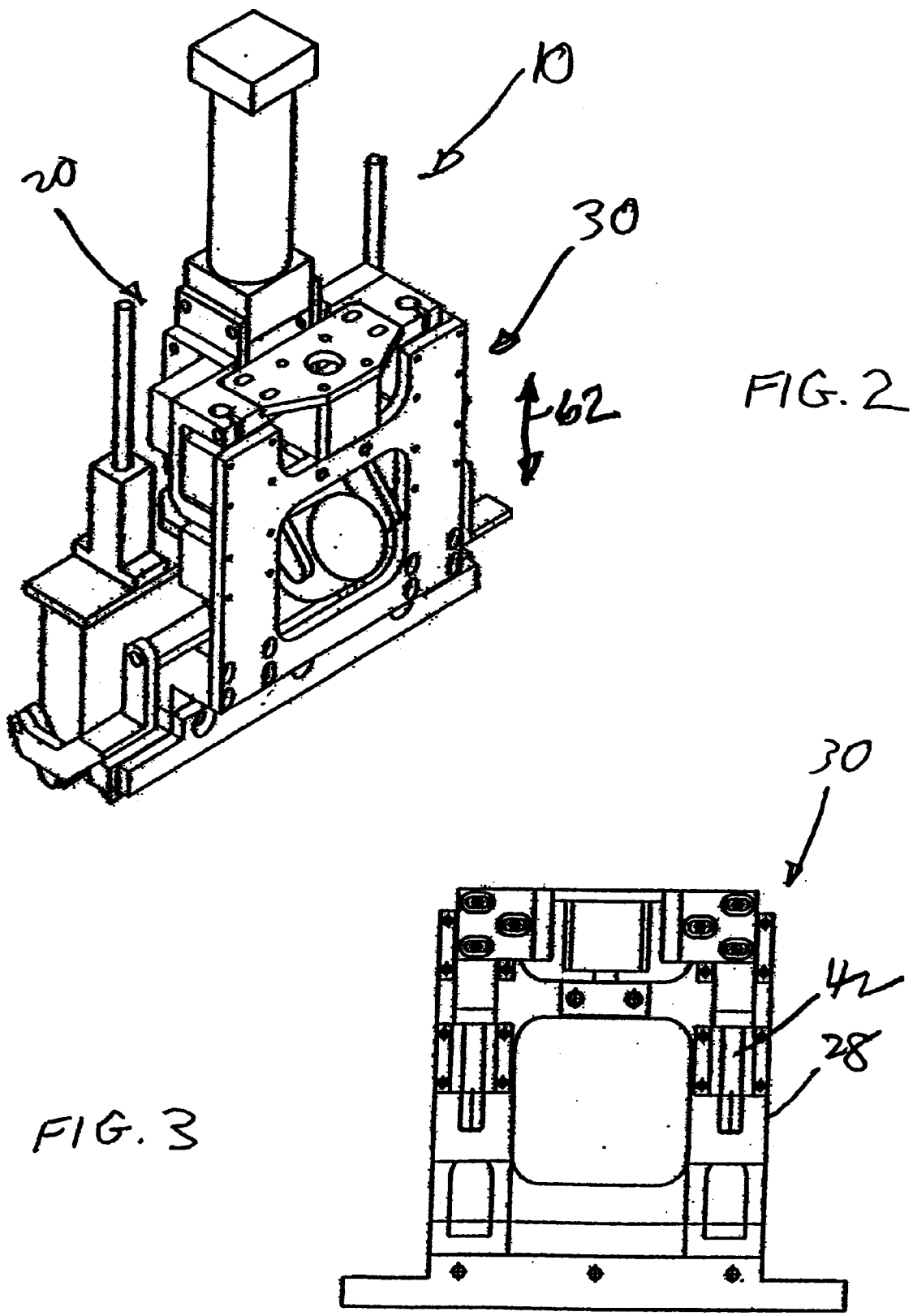
FIG. 2 is a perspective view of the assembled screening apparatus according to the present invention.
FIG. 3 is a front view of the squeegee assembly without the actuator parts.

Mounting plate 28 is in cooperative engagement with air cylinder 32 which enables mounting plate 28, and hence squeegee 34, to move up and down. Referring now to FIG. 3, the squeegee assembly 30 is shown from the side opposite to that shown in FIG. 1. For clarity, air cylinder 32 has been removed. Slides 42, normally coupled to air cylinder 32, are engaged with mounting plate 28. Operation of air cylinder 32, shown in FIG. 1, causes slides 42 to move up or down which, in turn, causes mounting plate 28, and hence squeegee 34, to move up and down. In this manner, the squeegee 34 can be raised or lowered as required in the screening operation and also, suitable downward pressure can be applied to the squeegee 34.

The assembled screening apparatus 10 is shown in FIG. 2. The vertical up and down movement of mounting plate 28 and squeegee 34 is indicated by arrows 62 in FIG. 2.

Referring now to FIG. 4, the screening apparatus 10 is shown schematically in its operating environment. Nest 58 supports a screening mask 50 which is placed over a greensheet 54 or other article to be screened. There may additionally be a sheet of backing material 56. In operation, screening apparatus 10 is placed adjacent to mask 50 and translated in the direction of arrow 46 by translating means 40. Due to the attachment of squeegee assembly 30 to paste dispensing apparatus 20, they move together in unison over the mask 50 in conjunction with translating means 40. Translating means 40 can be any mechanical, electrical, hydraulic or pneumatic apparatus which is suitably configured to move the screening apparatus 10 in the direction indicated by arrow 46. In the operational mode illustrated in FIG. 4, actuator bar 18 is actuated to cause shutter 22 to open and paste 48 to flow out from paste reservoir 15. In the prior art method of operation, a thin layer of the paste 48 would remain on the surface of mask 50 after screening. However, with the addition of trailing squeegee assembly 30 to the screening apparatus 10, squeegee 34 removes the excess of paste 48 from the mask 50 and also fills in features in mask 50 and on greensheet 54 that were not filled in, or were underfilled, by paste dispensing apparatus 20.

It is important to the present invention that the squeegee assembly 30, and more particularly the squeegee 34, is in close proximity to paste dispensing apparatus 20. The actual separation 60 between the squeegee assembly 30 and paste dispensing apparatus 20 can be readily determined by experimentation but two important factors need to be addressed. The first factor is the need to have the squeegee 34 in contact with the mask 50 at the same time as paste 48 is being dispensed by the paste dispensing apparatus 20. The reason for this is that when paste 48 is being dispensed by the paste dispensing apparatus 20, the mask 50 slightly deflects downwardly. The squeegee 34 should trail close enough behind the paste dispensing apparatus 20 so that the paste 48 is squeegeed before the mask 50 can deflect upwardly. If the mask 50 deflects upwardly before the paste 48 is squeegeed, defects will develop on the greensheet 54 because of loss of gasketing of the mask 50 to the greensheet 54.

The second factor is the need for the paste dispensing apparatus 20 and squeegee assembly 30 to be close enough so that when the paste dispensing apparatus 20 approaches the mask frame 52 (and thus ends its travel in the direction of arrow 46), the squeegee 34 has been able to traverse over the last active area of the mask 50 having features which need to be screened.

In view of the above factors, the inventors have found that a separation 60 between the paste dispensing apparatus 20 and squeegee assembly 30 of about one inch works well. Generally speaking, the squeegee assembly 30 should be adjacent to the paste dispensing apparatus 20.

EXAMPLES

A series of greensheets were extrusion screened with a viscous metallic paste that is typically used for extrusion screening. The mask pattern had both dense and isolated (single) lines. The lines ran in the directions parallel and perpendicular to the screening direction. For some of the greensheets, the nozzle of the paste dispensing apparatus had either a hard carbide tip or a softer so-called poly tip. No trailing squeegee was used in conjunction with the screening of these greensheets.

Other greensheets were screened according to the present invention with the paste dispensing apparatus in conjunction with a trailing squeegee. The nozzle of the paste dispensing apparatus had a stainless steel plus carbide tip. The squeegees used were double bevel polyurethane squeegees available from Pleiger Plastics, Washington, Pa. The squeegees had a durometer reading of 80 or 90.

The results are tabulated in the tables below. As can be seen from the tables, the average height of the lines favorably increased in every case where the trailing squeegee was utilized. Historically, it has been hard to get uniform line height and line fill for lines that are perpendicular to the screening direction have. The improved results of lines perpendicular to the screening direction due to the use of the trailing squeegee according to the present invention are particularly striking.

| Lines Perpendicular to Screening Direction | | |
| --- | --- | --- |
| | Single - Avg. Height ($\mu$m) | Dense - Avg. Height ($\mu$m) |
| Carbide nozzle | 23.70 | 21.01 |
| Poly nozzle (Durometer = 85 – 90) | 27.19 | 23.00 |
| Nozzle + Squeegee (Durometer = 90) | 41.41 | 25.13 |
| Nozzle + Squeegee (Duromter = 80) | 40.79 | 28.33 |

| Lines Parallel to Screening Direction | | |
| --- | --- | --- |
| | Single - Avg. Height ($\mu$m) | Dense - Avg. Height ($\mu$m) |
| Carbide nozzle | 25.04 | 20.83 |
| Poly nozzle (Durometer = 85 – 90) | 30.24 | 23.15 |
| Nozzle + Squeegee (Durometer = 90) | 36.11 | 26.34 |
| Nozzle + Squeegee (Duromter = 80) | 35.84 | 25.21 |

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A screening apparatus comprising:
    a paste dispensing apparatus for dispensing a paste onto a workpiece;
    a squeegee assembly having a squeegee blade in close proximity to, and separated from, the paste dispensing apparatus for squeegeeing the paste over the workpiece; and
    a means for translating the paste dispensing apparatus and squeegee assembly in unison with the squeegee assembly trailing behind the paste dispensing apparatus;
    wherein, in operation, the paste dispensing apparatus and squeegee assembly are placed adjacent to a workpiece and the paste dispensing apparatus and squeegee assembly are translated by the translating means in unison such that the paste is dispensed by the paste dispensing apparatus and then squeegeed by the trailing squeegee assembly, the squeegee assembly being in contact with the workpiece at the same time as the paste is being dispensed.

2. The screening apparatus of claim 1 wherein the squeegee assembly is directly connected to the paste dispensing apparatus.

3. The screening apparatus of claim 1 wherein the squeegee assembly comprises means for raising the squeegee assembly up and down with respect to the workpiece.

4. The screening apparatus of claim 1 wherein the squeegee assembly comprises a squeegee having a durometer reading of 80 to 90.

5. The screening apparatus of claim 1 wherein the paste dispensing apparatus is an extrusion paste dispensing apparatus.

6. The screening apparatus of claim 1 wherein the paste dispensing apparatus is a mesh screening paste dispensing apparatus.

7. A method of screening a workpiece through a mask wit a screening apparatus comprising a paste dispensing apparatus and a squeegee assembly, the method comprising the steps of:
    providing a mask having a plurality of openings over a workpiece;
    providing a screening apparatus comprising a paste dispensing apparatus for dispensing a paste onto the workpiece and a squeegee assembly having a squeegee blade in close proximity to, and separated from, the paste dispensing apparatus for squeegeeing the paste over the workpiece;
    placing the screening apparatus adjacent to the mask;
    translating the screening apparatus over the mask while simultaneously (i) dispensing a paste onto the mask and (ii) squeegeeing the paste with the squeegee assembly to force the dispensed paste into the mask openings and to remove excess paste from the mask.

8. The method of claim 7 wherein the mask is a metallic mask.

9. The method of claim 7 wherein the mask is a mesh mask.

10. The method of claim 7 wherein the squeegee assembly comprises a squeegee having a durometer reading of 80 to 90.

* * * * *